(12) United States Patent
Srinivasan et al.

(10) Patent No.: US 6,178,189 B1
(45) Date of Patent: Jan. 23, 2001

(54) MULTI-LAYER SEMICONDUCTOR DEVICES WITH STRESS-RELIEF PROFILES

(75) Inventors: Swaminathan Srinivasan; Rushikesh M. Patel, both of Tucson, AZ (US)

(73) Assignee: Opto Power Corporation, Tucson, AZ (US)

(*) Notice: Under 35 U.S.C. 154(b), the term of this patent shall be extended for 0 days.

(21) Appl. No.: 09/304,441

(22) Filed: May 3, 1999

Related U.S. Application Data

(63) Continuation-in-part of application No. 08/834,627, filed on Apr. 15, 1997, now abandoned.

(51) Int. Cl.$^7$ .............................. H01S 5/024; H01S 5/026
(52) U.S. Cl. ................................................ 372/36; 372/50
(58) Field of Search ........................................ 372/36, 50

(56) References Cited

U.S. PATENT DOCUMENTS 4,069,463 * 1/1978 McGroddy et al. .................. 372/36

OTHER PUBLICATIONS

Zory, P. S., Continuous Wave Laser Array, IBM Technical Disclosure Bulletin vol. 18, No. 10, pp. 3497 and 3498, Mar. 1976.*

* cited by examiner

Primary Examiner—James W. Davie
(74) Attorney, Agent, or Firm—Herbert M. Shapiro

(57) ABSTRACT

Multi-layer, semiconductor devices are configured to reduce stress by the removal of much of the structure which does not actually contribute to device performance. In one embodiment, trough between mesas which define light emitting facets in a laser diode bar are etched well into the substrate to remove all layers of different compositions there. In another embodiment, troughs are also etched in the backside of the substrate of a laser diode structure where the troughs are aligned along axes perpendicular to the axes of the mesas. The removal of stress permits more accurate alignment of the multiple facets along a single axis when the laser bar is bonded to a heat sink. The accurate alignment minimizes the placement constraints on the position of a microlens for achieving maximum power output and coupling efficiency for optical fibers coupled to the microlens.

4 Claims, 2 Drawing Sheets

MULTI-LAYER SEMICONDUCTOR DEVICES WITH STRESS-RELIEF PROFILES

REFERENCE TO RELATED APPLICATIONS

The present application is a continuation-in-part of U.S. patent application Ser. No.08/834,627 filed Apr. 15,1997 and assigned to the assignee of the present application, now abandoned.

FIELD OF THE INVENTION

This invention relates to multi-layered semi-conductor devices and more particularly to laser diodes which tend to bow out from the desirable planar configuartion for which they are designed.

BACKGROUND OF THE INVENTION

Multi-layered laser diodes are well known in the art. Such devices are fabricated by metal organic chemical vapor deposition techniques in which successive layers are deposited on a substrate surface to define buffer layers with the substrate and, in succession, a cladding layer, a waveguide layer, an active region, another waveguide layer, a cladding layer and a contact layer. The layers comprise different compositions, require different changes in temperature and have different coefficients of expansion. Thus, stress is often introduced into the structure which causes the devices to bow out of plane.

A variety of techniques have been employed to compensate for such bowing. Thus, such structures have been secured to a planar plate. Also, fiber optic bundles have been secured to match such bowing and coupled to the bowed devices. The invention is based on the recognition that about one half of the bowing is attributed to stress induced by those successive layers of different compositions.

BRIEF DESCRIPTION OF ILLUSTRATIVE EMBODIMENTS OF THIS INVENTION

In accordance with the principles of this invention, a bowed diode is etched to remove portions of the device where multiple layers produce stress and which are non-contributory to device performance. In one embodiment in which bowed diodes are formed with mesas, from the front facet of which light is emitted, the troughs between the mesas are etched into the substrate to remove multi-layer, non contributing portions of the device. In another embodiment, the substrate of the device is made relatively thick initially and slots are etched into the backside of the device along axes perpendicular to the axes of mesas which define the emitting facets.

DETAILED DESCRIPTION OF ILLUSTRATIVE EMBODIMENTS OF THIS INVENTION

Figure 1:
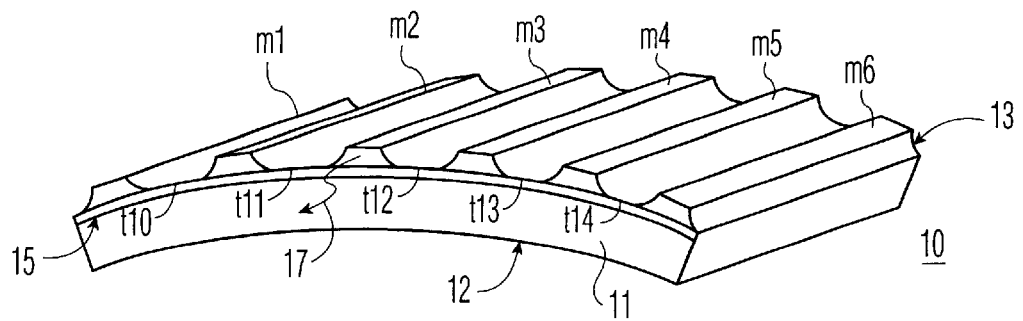
FIG. 1 is a projection view of a prior art laser diode showing a plurality of mesas which define light emitting facets.

FIG. 1 illustrates a laser diode structure 10 typical of the prior art. The structure comprises a substrate 11 having top and rear surfaces 12 and 13, respectively. A plurality of mesas, six illustratively, have designations ml, m2, m3, m4, m5, and m6.

Laser diodes are formed by depositing a succession of epitaxial layers of different compositions in the substrate at the top surface thereof. These layers are indicated at 15 and typically comprise buffer, cladding, waveguide, and active layers as is well understood in the art.

Mesas are formed in the top surface of the substrate by etching troughs down through the active layer to prevent light coupling between mesas. Each mesa defines a light emitting facet as represented by the crooked arrow 17 directed outwardly from the front face of mesa m3 as viewed in the figure.

Figure 2:
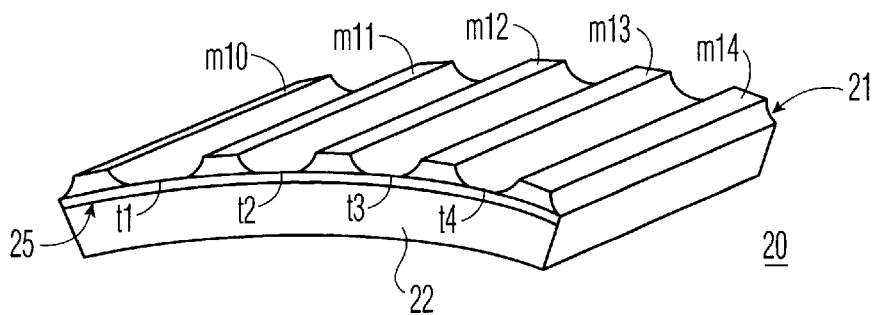
FIG. 2 is a projection view of a laser diode showing a plurality of mesa, as in FIG. 1, but showing stress-relief profile in accordance with the principles of this invention.

FIG. 2 shows a laser diode structure 20 which also includes a plurality of (illustratively five) mesas designated m10 through m14 similarly defined at the top surface 21 of substrate 22. In accordance with the principles of this invention, the troughs between mesas are etched down through layer 25 into substrate 20 to penetrate all the layers of different composition to remove any stress in the structure attributed to such layers. The troughs are designated t1 through t4 in FIG. 2 and can be seen to penetrate through all layers of different composition. This is to be contrasted with prior art troughs, designated t10 through t14 in FIG. 1 which can be seen to be too shallow to penetrate through layers 15.

Figure 3:
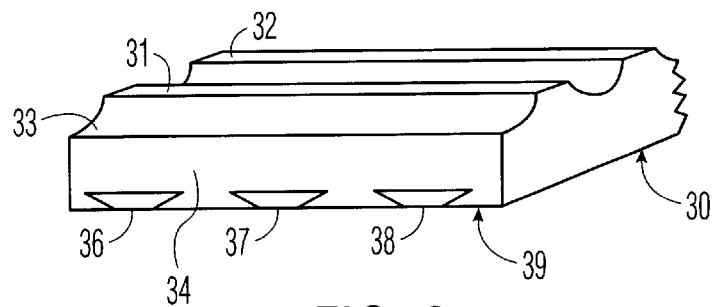
FIG. 3 is a side view of an alternative embodiment in accordance with the principles of this invention.

FIG. 3 shows an alternative embodiment of this invention. The figure shows a portion 30 of a laser diode illustrating a side view corresponding to a view from the right with respect to the structures of FIGS. 1 or 2. First and second mesas 31 and 32 are formed at the top surface 33 of substrate 34 of the structure. Slots 36, 37, and 38 are formed at the bottom surface 39 of the structure. The substrate, in this embodiment may be made considerably thicker than the substrate of a prior art laser diode structure without adverse effects because of the presence of slots in the rear or bottom surface of the substrate.

Figure 4:
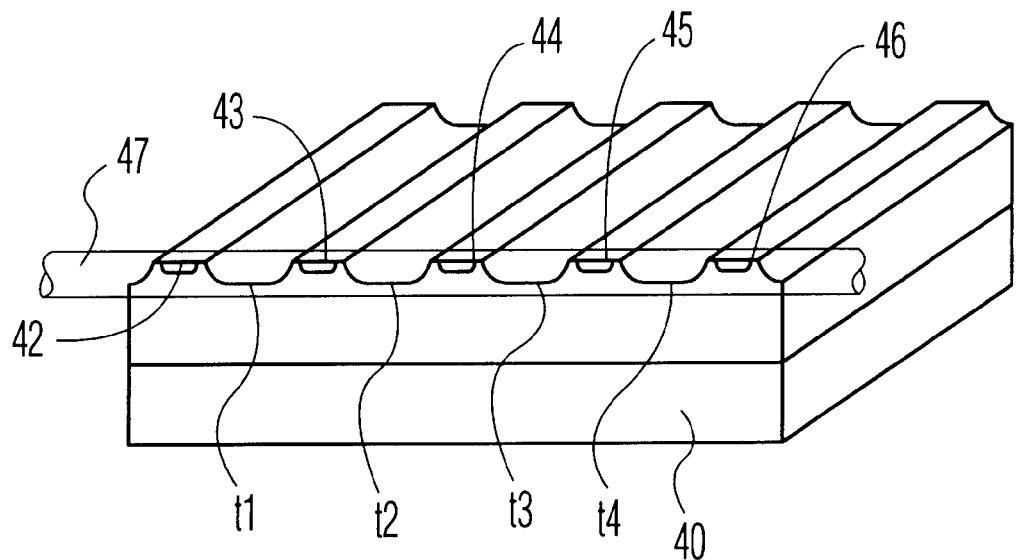
FIGS. 4 and 5 are schematic representations of laser diode structures of the type shown in FIGS. 2 and 3 bonded to the surface of heat sinks.

FIG. 4 shows a laser diode structure, with a plurality of mesas, (as shown in FIG. 2) bonded to the top surface of a heat sink 40. The presence of the troughs (e.g. t0 to t4 of FIG. 2) permits the laser diode structure to be bonded without any bowing thus resulting in the emitting facets (42, 43, –46) being aligned accurately along a single axis and permitting the proper positioning along that axis of a microlens 47 for maximum power output from each facet. Any misalignment of the emitting facets results in a compromise position for the microlens which reduces the output power of any misaligned facet.

Typically, optical fibers (not shown) are coupled to microlens 47 for transmitting the output power from corresponding ones of the plurality of emitting facets as is well understood in the art.

Figure 5:
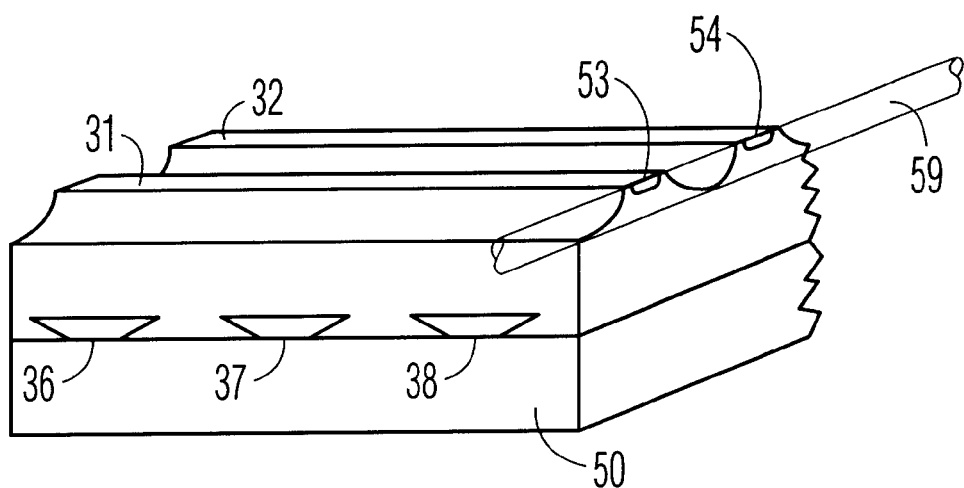

FIG. 5 shows a laser diode structure of the type shown in FIG. 3 bonded to the top surface of a heat sink 50 in the virtual absence of bowing. Again an accurate alignment of the emitting facets (53, 54—) permits the proper positioning of microlens 59.

In one specific example of a laser diode structure, in accordance with the present invention, the substrate is between 100 to 150 microns thick and the mesas have a height of between three and six microns. In embodiments in which the substrate has an initial thickness of 150 microns, the mesa height, in accordance with the principles of this invention is about fifty microns, defined by troughs which reach into the top surface of the substrate well beyond the epitaxial layers of different compositions. Further, the troughs occupy as much as 50% of the top surface area of the structure.

Stress in such structures is due to the presence of (1) dielectric or metal patterns deposited during processing; (2) assembly operations; and (3) contiguous expitaxial layers of different compositions. In structures of the type disclosed herein, the stress contribution due to the epetaxial layers is up to about 50% of the total stress induced.

In the absence of troughs to the depth represented in FIG. 2 or of the type illustrated in FIG. 3, bowing of as much as 10 microns is characteristic of such devices. This leads to fiber aligrnent problems as well as processing and efficiency problems. Devices characterized by the troughs disclosed herein reduce the bowing, typically from a prior art value of 10 microns to a much smaller value of 5 microns easing the constraints on alignment and processing procedures.

What is claimed is:

1. A laser diode bar having a plurality of lase diodes therein, said bar comprising a substrate having top and bottom surfaces, a plurality of mesas formed on said top surface for defining a plurality of light emitting facets and including successive layers of different compositions therein, said bar being characterized by a plurality of troughs between said mesas, said troughs extending into said substrate to a depth to remove all of said layers of different compositions there, said bar including a plurality of troughs in said bottom surface, said trout being aligned along axes perpendicular to the axes of said mesas wherein said bottom surface is bonded to the surface of said heat sink.

2. A laser diode bar having a plurality of laser diodes therein, said bar having a top and a bottom surface and including a succession of different compositions for defining active, waveguide and cladding layers, said bar including a plurality of troughs for defining a plurality of mesas in said top surface for defining a plurafity of light-emitting facets, said troughs being free of any materials therein, said troughs penetrating said substrate to a distance such that all of said layers are removed there, said bottom surface of said bar being bonded to a heat sink.

3. A laser diode bar, said bar having top and bottom surfaces, a plurality of mesas formed on said top surface, said bar including a plurality of troughs in said bottom surface, said troughs being aligned along axes perpendicular to the axes of said mesas, said bottom surface being bonded to the surface of a heat sink.

4. A laser diode bar as in claim 3 said bar including a plurality of troughs in said top surface, said troughs defining said mesas.

* * * * *